United States Patent [19]
Wyatt

[11] Patent Number: 5,339,055
[45] Date of Patent: Aug. 16, 1994

[54] SERRODYNE PHASE MODULATOR HAVING RAMP GENERATED BY COMBINING TWO OSCILLATOR SIGNALS

[75] Inventor: Michael A. Wyatt, Clearwater, Fla.

[73] Assignee: Honeywell Inc., Minneapolis, Minn.

[21] Appl. No.: 992,551

[22] Filed: Dec. 18, 1992

[51] Int. Cl.[5] .......................... H03C 3/00; H03K 4/08
[52] U.S. Cl. ..................................... 332/144; 331/48; 307/228; 328/185
[58] Field of Search ............... 332/144, 146, 147, 148; 307/228; 328/181, 184, 185; 356/350; 385/3; 331/46, 48

[56] References Cited

U.S. PATENT DOCUMENTS

| | | | |
|---|---|---|---|
| 3,187,262 | 6/1965 | Crane | 328/133 |
| 4,017,801 | 4/1977 | Riedel | 328/181 X |
| 5,018,859 | 5/1991 | Chang et al. | 356/350 |
| 5,054,923 | 10/1991 | Okada | 356/350 |

*Primary Examiner*—Siegfried H. Grimm
*Attorney, Agent, or Firm*—Thomas A. Rendos

[57] ABSTRACT

A frequency phase modulator which generates a phase modulator controlled slope voltage waveform. The controlled slope voltage waveform is controlled by coupling a first fixed frequency oscillator with a second variable frequency voltage controlled oscillator. The period of the ramp waveform (slope) is equal to the difference between the two frequencies. The phases of the two oscillators are compared and integrated to produce the phase modulator ramp waveform.

2 Claims, 1 Drawing Sheet

SERRODYNE PHASE MODULATOR HAVING RAMP GENERATED BY COMBINING TWO OSCILLATOR SIGNALS

FIELD OF THE INVENTION

The present invention relates generally to frequency phase modulators and more particularly to an improved serrodyne phase modulator with an improved phase modulation waveform generator.

BACKGROUND OF THE INVENTION

Frequency translators or phase modulators have many applications in various signal generating and processing areas, such as variable frequency and other types of signal sources. Serrodyne type phase modulators create a phase shift as a function of time to produce a frequency translation in a phase modulator. The phase modulator includes an input frequency, which is acted on by the phase modulator to produce a translated output frequency. The frequency translation is achieved by producing a $\phi t$ function which causes a frequency translation of $\Delta \omega$ in the phase modulator. The function $\phi t$ requires an ever increasing phase shift. This requirement is not practical in conventional circuitry.

The $\phi t$ function can be produced if $\phi t$ is reset after reaching $2\pi$. The frequency phase modulator operates on this principle, creating a magnitude increasing phase change until $2\pi$ is reached, resetting to zero (0) and then continuing. For some high resolution applications, i.e. high linearity it is necessary to precisely control the slope of the increasing magnitude waveform. High linearity is difficult to achieve in prior art frequency phase modulators, especially where the time period is relatively long.

The present invention therefore was developed to generate a highly linear controlled slope waveform in a frequency phase modulator, for utilization, for example in high resolution variable frequency sources and fiber optic gyros.

SUMMARY OF THE INVENTION

The present invention is directed to an improved frequency phase modulator which generates a phase modulator highly linear controlled slope voltage waveform. The controlled slope voltage waveform is controlled by coupling a first frequency fixed oscillator with a second frequency variable voltage controlled oscillator. The period of the ramp waveform (slope) is equal to the difference between the two frequencies. The transitions of the two oscillators are compared and integrated to produce the phase modulator ramp waveform.

These and other features and advantages of the invention will be more readily apparent upon reading the following description of a preferred exemplified embodiment of the invention and upon reference to the accompanying drawings wherein:

Figure 1:
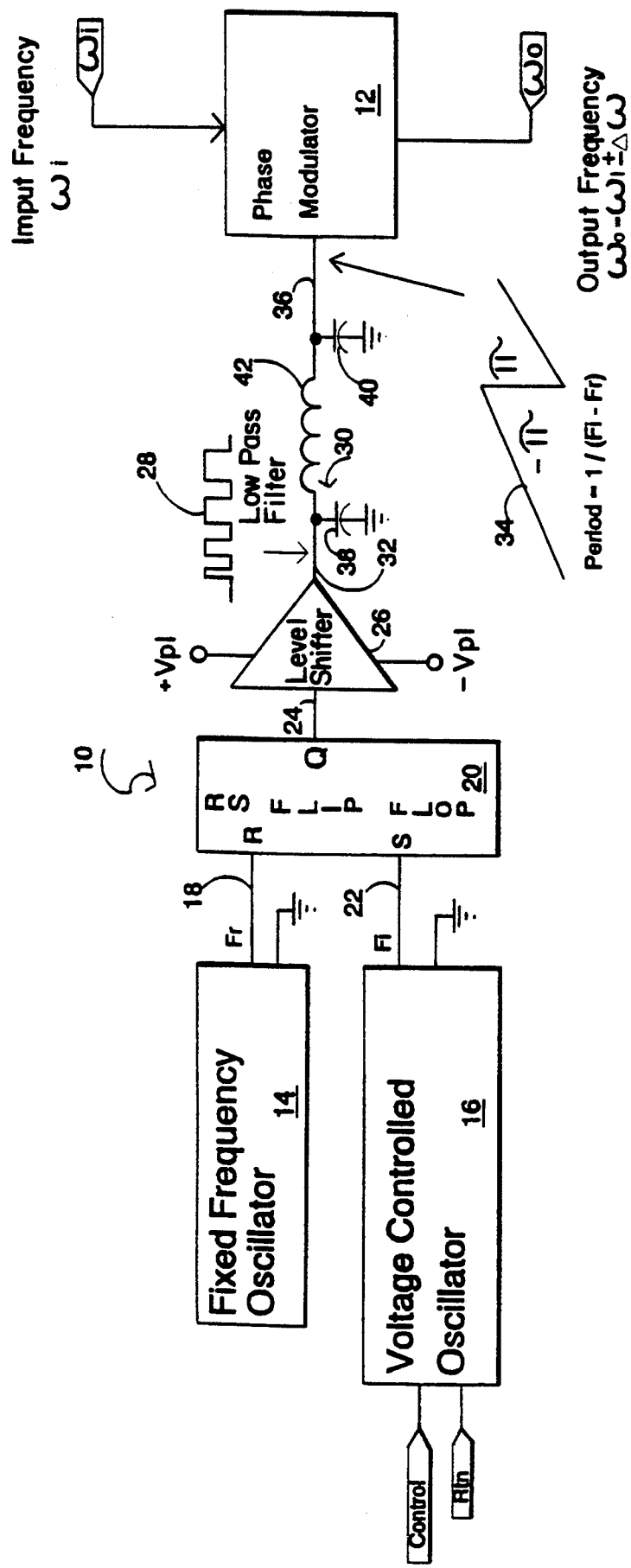
FIG. 1 is a schematic and block diagram of one embodiment of the frequency phase modulator of the present invention.

While the invention will be described and disclosed in connection with certain preferred embodiments and procedures, it is not intended to limit the invention to those specific embodiments. Rather it is intended to cover all such alternative embodiments and modifications as fall within the spirit and scope of the invention.

DESCRIPTION OF THE PREFERRED EMBODIMENT

Referring to FIG. 1, one embodiment of a frequency phase modulator of the present invention is designated generally by the reference numeral 10. The phase modulator 10 includes a conventional phase modulator 12, such as an electro/optical phase modulator, which receives an input frequency $\omega i$ which has a frequency shift of $\pm \Delta \omega$ which generates an output frequency $\omega o$ which is equal to $\omega i \pm \Delta \omega$.

The present invention is directed to the generation of the phase modulator voltage waveform which drives the phase modulator 12. The voltage waveform is required to rise or fall to a voltage level which produces a $2\pi$ phase change in the phase modulator 12 and then resets quickly to zero (0) and continues. The $2\pi$ phase change is generated in the frequency phase modulator 10 by generating a voltage waveform which rises to a level of $\pi$ (or $-\pi$) and resets to a level of $-\pi$ (or $\pi$) which produces the required $2\pi$ phase change.

The voltage waveform is generated by a pair of oscillators 14 and 16. The oscillator 14 is a fixed frequency oscillator which generates a first fixed frequency Fr on a line 18. The frequency Fr is coupled to the R input of a set-reset (RS) flip flop 20 to reset the flip flop 20. The flip flop 20 is set by a frequency Fi coupled to the S input on a line 22. The frequency Fi is generated by the second oscillator 16 which is a voltage controlled oscillator (VCO). The oscillator 14 can be a fixed frequency crystal oscillator or an internal clock signal. The VCO 16 can be a voltage controlled crystal oscillator or a multi-vibrator.

The period of the voltage waveform is equal to the inverse of (Fi-Fr), which thus effects the frequency translation in the phase modulator 12. The VCO 16 is utilized to change the period, hence the slope of the voltage waveform. Where Fi is greater than Fr, the flip flop 20 sets more than resets and hence the voltage waveform slope increases. If Fi is less than Fr, then the flip flop 20 resets more than sets and the waveform voltage slope decreases.

The frequencies Fr and Fi are coupled to the flip flop 20, which generates a Q pulse output on a line 24 which is coupled to a conventional level shifter 26. The level shifter 26 shifts the Q pulse output to an output pulse having a voltage level of $\pm V_{pi}$, depending upon whether the Q pulse is high or low. The voltage level $V_{pi}$ output pulse is the level required by the phase modulator 12 to generate a $\pi$ phase shift. The output pulses are illustrated by a waveform 28. The output pulses 28 are coupled to a low pass filter 30 on a line 32.

The low pass filter 30 integrates the output pulses 28 to produce a ramp waveform 34, which is coupled to the phase modulator 12 on a line 36. The reset time of the ramp waveform 34 is dictated by the transient response of the low pass filter 30 and must be small compared to the ramp period for good frequency translation fidelity in the phase modulator 12. The ramp waveform 34 has a period which is determined by the inverse of (Fi-Fr). The low pass filter 30 includes a pair of capacitors 38 and 40 and a coil 42, which are selected for the particular design frequency range of the frequency phase modulator 10. Other types of low pass filters also could be employed, depending upon the desired frequency range.

Modification and variations of the present invention are possible in light of the above teachings. The oscillators 14 and 16 can be of various types, again depending upon the desired frequency range. It is therefore to be understood that within the scope of the appended claims, the invention may be practiced other than is specifically described.

The embodiments of an invention in which an exclusive property or right is claimed are defined as follows:

1. A frequency phase modulator, comprising:
    phase modulating means coupled to an input frequency for generating a modulated output frequency;
    fixed frequency generator means for generating a first frequency output;
    variable frequency generating means for generating a second frequency output;
    flip-flop means coupled to said fixed frequency generating means and said variable frequency generating means for generating a plurality of pulses in response to said first and said second frequency output; and
    means coupled to said phase modulating means for converting said pulses to a voltage ramp waveform to vary said modulated output frequency, said converting means including level shifting means for generating pulses having a voltage level for causing a $\pi$ phase change in said phase modulating means.

2. The frequency phase modulator according to claim 1, wherein said converting means further includes integrating means for generating said voltage ramp waveform.

* * * * *